(12) United States Patent
Huang

(10) Patent No.: US 11,264,083 B2
(45) Date of Patent: Mar. 1, 2022

(54) DATA PROTECTION SYSTEM AND PROTECTION METHOD OF DISPLAY APPARATUS

(71) Applicant: HKC Corporation Limited, Shenzhen (CN)

(72) Inventor: Xiaoyu Huang, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 533 days.

(21) Appl. No.: 16/334,122

(22) PCT Filed: Nov. 21, 2018

(86) PCT No.: PCT/CN2018/116598
§ 371 (c)(1),
(2) Date: Mar. 18, 2019

(87) PCT Pub. No.: WO2020/093451
PCT Pub. Date: May 14, 2020

(65) Prior Publication Data
US 2021/0358537 A1 Nov. 18, 2021

(30) Foreign Application Priority Data
Nov. 9, 2018 (CN) .......................... 201811331482.3

(51) Int. Cl.
*G06F 3/14* (2006.01)
*G06F 13/40* (2006.01)
(Continued)

(52) U.S. Cl.
CPC ............ *G11C 11/4093* (2013.01); *G11C 5/06* (2013.01); *G11C 11/4076* (2013.01);
(Continued)

(58) Field of Classification Search
CPC ... G11C 11/4093; G11C 5/06; G11C 11/4076; G11C 11/4096
(Continued)

(56) References Cited

U.S. PATENT DOCUMENTS

2018/0308416 A1* 10/2018 Chen .......................... G06T 1/60
2020/0143860 A1* 5/2020 He ............................. G11C 7/24
(Continued)

FOREIGN PATENT DOCUMENTS

| CN | 108595364 A | * | 9/2018 |
| CN | 109634892 A | * | 4/2019 |

(Continued)

*Primary Examiner* — Ly D Pham
(74) *Attorney, Agent, or Firm* — Juan Carlos A. Marquez; Marquez IP Law Office, PLLC

(57) ABSTRACT

This application relates to a data protection system and protection method of a display apparatus, and the system comprises a memory, a TCON, and a switcher. The switcher selectively outputs a constant potential signal and a read/write control signal to a memory according to a potential change of a control signal. When the switcher transmits and outputs the constant potential signal to the memory, the switcher disconnects an electrical coupling between the read/write control signal and a protection control end. The memory maintains timing control data to be write-protected according to the obtained signal, or switches the timing control data to be readable-and-writable or write-protected.

17 Claims, 6 Drawing Sheets

(51) Int. Cl.
  *G11C 11/4076* (2006.01)
  *G11C 5/06* (2006.01)
  *G11C 11/4093* (2006.01)
  *G11C 11/4096* (2006.01)

(52) U.S. Cl.
  CPC ........ *G11C 11/4096* (2013.01); *G06F 3/1407* (2013.01); *G06F 13/4022* (2013.01)

(58) Field of Classification Search
  USPC ..................................................... 365/233.1
  See application file for complete search history.

(56) References Cited

U.S. PATENT DOCUMENTS

2020/0251056 A1\* 8/2020 Huang ................. G09G 3/2096
2021/0020212 A1\* 1/2021 He ........................... G09G 3/20

FOREIGN PATENT DOCUMENTS

| JP | 3955932 B2 | \* | 8/2007 | ............. G11C 11/22 |
| KR | 20160093919 A | \* | 8/2016 | |
| KR | 20170050620 A | \* | 5/2017 | |

\* cited by examiner

DATA PROTECTION SYSTEM AND PROTECTION METHOD OF DISPLAY APPARATUS

CROSS REFERENCE TO RELATED APPLICATIONS

This application claims priority to Chinese Patent Application No. CN 201811331482.3, filed with the Chinese Patent Office on Nov. 9, 2018 and entitled "Data Protection System And Protection Method Of Display Apparatus", which is incorporated herein by reference in its entirety.

TECHNICAL FIELD

This application relates to the field of display technologies, and specifically, to a data protection system and protection method of a display apparatus.

BACKGROUND

In a display, a system mainboard is connected to a control board (C-board) by using a line, the C-board is connected to a printed circuit board (PCB) by using a flexible flat cable (FFC), and the PCB is connected to a display area by using a source-chip on film (S-COF) and a gate-chip on film (G-COF). A method for driving the display includes: The system mainboard transmits a color (for example, R/G/B) compression signal, a control signal, and power to the C-board. After a signal is processed by a timing controller (TCON), the signal is transmitted to a source drive circuit (source driver) and a gate drive circuit (gate driver). Necessary data and power are transmitted to the display area by using a related integrated circuit or chip, so that the display obtains power and signal required for displaying an image.

On a drive board of the display, a programmable and erasable memory (EEPROM) is provided. The EEPROM is configured to store control data and setting (TCON Code) of the TCON. However, when the TCON reads data, the data stored in the EEPROM is usually rewritten. During starting, system input, or related working of the display apparatus, the TCON reads the control data stored in the EEPROM, to complete an initialized setting of the TCON. A write protect (WP) signal of the EEPROM is at a high potential (H) in a normal state, in other words, the EEPROM needs to be in a write-protected state normally. However, line materials or other interference may cause the WP signal to be invalid, and consequently, the control data stored in the EEPROM may be rewritten due to an incorrect action, leading to an abnormal display image and frequent errors.

SUMMARY

To resolve the foregoing technical problem, an objective of this application is to provide a data protection system and protection method of a display apparatus, to control a data write-protected or data readable-and-writable mechanism of a storage element by connecting or disconnecting an electric coupling between the storage element and a read/write control signal.

The objective of this application is achieved and the technical problem of this application is resolved by using the following technical solution.

A data protection system of a display apparatus provided according to this application includes: a memory, having a protection control end and storing timing control data; a TCON, connected to the memory, where the TCON obtains the timing control data to provide a control signal; and a switcher, including a first input end, a second input end, a control end, and an output end, where the first input end is electrically coupled to a read/write control signal, the second input end is electrically coupled to a constant potential signal, the output end is connected to the protection control end, the control end transmits the control signal, and the switcher selectively outputs the constant potential signal and the read/write control signal to the protection control end according to a potential change of the control signal, where when the switcher transmits and outputs the constant potential signal to the protection control end, the switcher disconnects an electrical coupling between the read/write control signal and the protection control end, the protection control end is electrically coupled to the constant potential signal, and the memory maintains the timing control data to be write-protected.

The technical problem of this application may further be implemented by using the following technical measure.

In an embodiment of this application, the switcher includes a first resistor, a first switch, and a trigger circuit. a first end of the first switch is electrically coupled to the read/write control signal, and a second end of the first switch is connected to the protection control end; a first end of the first resistor is electrically coupled to the constant potential signal, and a second end of the first resistor is electrically coupled between the second end of the first switch and the protection control end; and an input end of the trigger circuit is the control end, and an output end of the trigger circuit is connected to a control end of the first switch, where the output end of the trigger circuit transmits a switch signal corresponding to the potential change of the control signal, to switch on or off the first switch; and the first switch is switched off, the electrical coupling between the read/write control signal and the protection control end is disconnected, the protection control end is electrically coupled to the constant potential signal, the first switch is switched on, and the protection control end is electrically coupled to the read/write control signal.

In an embodiment of this application, the trigger circuit includes a trigger and a second switch; a first end of the trigger is the control end, and a second end of the trigger is electrically coupled to the constant potential signal; and a first end of the second switch is connected to an output end of the trigger, and a second end of the second switch is connected to the control end of the first switch, where the control end of the first switch and a control end of the second switch have a same polarity, the trigger outputs the constant potential signal to the first end of the second switch according to the potential change of the control signal, the control end of the second switch is electrically coupled to the constant potential signal, the second switch is switched on, and the constant potential signal is transmitted to the control end of the first switch.

In an embodiment of this application, the control signal is a clock pulse signal, and when the clock pulse signal is at a rising edge, the trigger outputs the constant potential signal.

In an embodiment of this application, a unilateral conduction component is disposed between the first switch and the second switch, an input end of the unilateral conduction component is connected to the second end of the second switch, and an output end of the unilateral conduction component is connected to the control end of the first switch.

In an embodiment of this application, a second resistor is connected to the second switch and the unilateral conduction component, a first end of the second resistor is connected between the second switch and the unilateral conduction component, and a second end of the second resistor is grounded.

In an embodiment of this application, the unilateral conduction component is a diode.

In an embodiment of this application, the memory, the TCON, the first resistor, and a second switch are disposed on a drive board of the display apparatus.

In an embodiment of this application, the trigger circuit is disposed in a frame area or a distribution area of a display panel.

In an embodiment of this application, the protection control end is electrically coupled to the read/write control signal, and the storage unit switches, according to a potential change of the read/write control signal, the timing control data to be readable-and-writable or write-protected.

In an embodiment of this application, the constant potential signal is a constant high-potential signal.

In an embodiment of this application, the constant potential signal is a constant low-potential signal.

Another objective of this application is to provide a data protection method of a display apparatus, including: providing a control signal by using a timing controlling unit; selectively outputting a constant potential signal and a read/write control signal to a storage unit by using a switching module according to a potential change of the control signal; and maintaining timing control data to be write-protected when the storage unit is electrically coupled to the constant potential signal.

In an embodiment of this application, when the storage unit obtains the read/write control signal, the storage unit switches, according to the potential change of the read/write control signal, the timing control data to be readable-and-writable or write-protected.

In an embodiment of this application, the switching module includes a first switch and a trigger circuit, and the step of selectively outputting a constant potential signal and a read/write control signal to a storage unit by using a switching module according to a potential change of the control signal includes: controlling switching-on and switching-off of the first switch by using a switch signal output by the trigger circuit, where a potential change of the switch signal corresponds to the potential change of the control signal, where when the first switch is switched on, the storage unit is electrically coupled to the read/write control signal by using the first switch; or when the first switch is switched off, the first switch disconnects an electrical coupling between the storage unit and the read/write control signal, and the storage unit is electrically coupled to the constant potential signal.

Still another objective of this application is to provide a data protection system of a display apparatus, including: a storage unit, having a protection control end and storing timing control data; a timing controlling unit, connected to the storage unit, where the timing controlling unit obtains the timing control data to provide a clock pulse signal; a first switch, where a first end of the first switch is electrically coupled to a read/write control signal, and a second end of the first switch is connected to the protection control end; a first resistor, where a first end of the first resistor is electrically coupled to a constant high-potential signal, and a second end of the first resistor is connected between the second end of the first switch and the protection control end; a trigger, where a first end of the trigger is electrically coupled to the control signal, and a second end of the trigger is electrically coupled to a constant high-potential signal; a second switch, where a first end of the second switch is electrically coupled to an output end of the trigger, a control end of the second switch is electrically coupled to a constant high-potential signal, and the second switch is switched on; a diode, where an input end of the diode is connected to a second end of the second switch, and an output end of the diode is connected to a control end of the first switch; and a second resistor, where a first end of the second resistor is connected between the second switch and a unilateral conduction component, and a second end of the second resistor is grounded, where when the clock pulse signal at a rising edge, the trigger outputs the constant high-potential signal, the constant high-potential signal is transmitted to the control end of the first switch by using the second switch and the diode, the first switch is switched on, the protection control end is electrically coupled to the read/write control signal, and the storage unit switches, according to a potential change of the read/write control signal, the timing control data to be readable-and-writable or write-protected; or when the clock pulse signal is at a falling edge or a low potential or has no signal, the trigger has no output, the first switch is switched off to disconnect an electrical coupling between the protection control end and the read/write control signal, and when the memory is electrically coupled to the constant potential signal, the storage unit maintains the timing control data to be write-protected.

In this application, a data write-protected or data readable-and-writable mechanism of the storage element is controlled by connecting and disconnecting the electrical coupling between the storage element and the read/write control signal, so as to avoid an incorrect setting of a write protection state of the memory which leads to re-writing of the timing control data, and avoid an abnormal image of the display apparatus.

DETAILED DESCRIPTION

Figure 1:
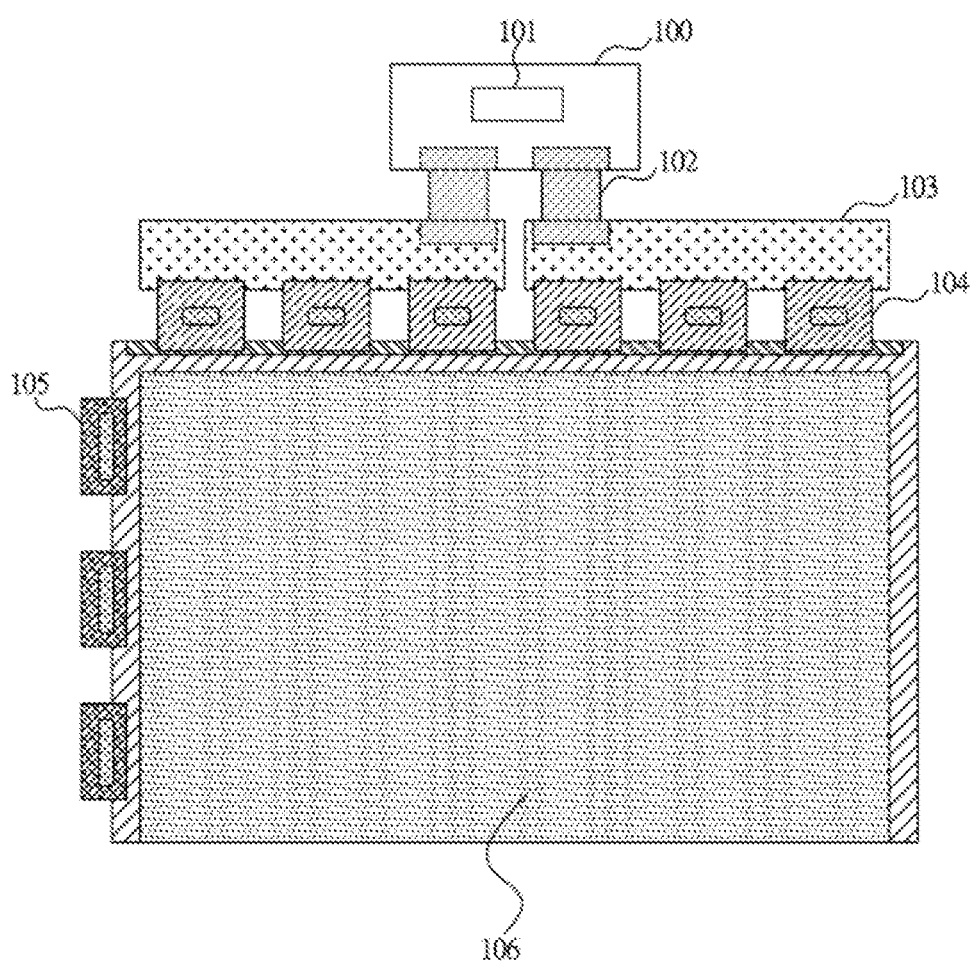
FIG. 1 is a schematic architectural diagram of an exemplary display apparatus.

Descriptions of the following embodiments are made with reference to the accompanying drawings, so as to exemplarily describe the specific embodiments of this application that can be implemented. The directional terms mentioned in this application, like "on", "below", "front", "back", "left", "right", "inner", "outer", and "side surface" refer to the directions in the accompanying drawings. Therefore, the directional terms used herein are merely used for illustrating and explaining this application rather than limiting this application.

The accompanying drawings and the descriptions should be considered, in essence, to be exemplary rather than limiting. In the drawings, units having similar structures are denoted by same reference numerals. In addition, for the ease of understanding and description, the sizes and thicknesses of components shown in the accompanying drawings are arbitrarily shown, but this application is not limited thereto.

In the accompanying drawings, for clarity, thicknesses of a layer, a film, a panel, an area, and the like are enlarged, and configuration ranges of circuits are also enlarged. In the accompanying drawings, for the ease of understanding and description, thicknesses of some layers and areas are enlarged, and configuration ranges of circuits are also enlarged. It should be understood that when a component such as a layer, a film, an area, a circuit, or a base is described to be "on" another component, the component may be directly on the another component, or there may be an intermediate component.

In addition, throughout this specification, unless otherwise explicitly described to have an opposite meaning, the terms "comprise", "include" and variants thereof should be construed as including the component, but not excluding any other component. In addition, throughout the specification, "on" means that one is located above or below a target component and does not necessarily mean that one is located on the top based on a gravity direction.

To further describe the technical means adopted in this application to achieve the intended application objective and effects thereof, specific implementations, structures, features, and effects of a display panel and a display device of this application are described below in detail with reference to the accompanying drawings and exemplary embodiments FIG. 1 is a schematic architectural diagram of an exemplary display apparatus. The display apparatus includes: a C-board 100, where the C-board 100 includes a TCON 101; and a PCB 103, connected to the C-board by using an FFC 102, where a source drive circuit 104 and a gate drive circuit 105 are respectively connected to a data line and a scanning line in a display panel 106. In some embodiments, the gate drive circuit 105 and the source drive circuit 104 include but are not limited to being in a form of a chip on film. In some embodiments, the gate drive circuit 105 includes but is not limited to being in a form of a gate on array (GOA). The gate drive circuit 105 may be classified into a level shifter and a shift register. The level shifter is disposed on the C-board, and the shift register is disposed an active array substrate.

A method for driving the display apparatus includes: The system mainboard provides a color (for example, R/G/B) compression signal, a control signal, and power, and transmits the color compression signal, the control signal, and the power to the C-board 100. After the TCON 101 on the C-board 100 processes the signals, the signals and the power processed by the driver circuit are transmitted to the gate drive circuit 105 and the source driver 104 of the PCB 103 by using the FFC 102. The gate drive circuit 105 and the source driver 104 transmit necessary data and power to the display panel 106, so that the display apparatus obtains power and signals required for displaying an image.

The panel is switched on by switching on each data line by line. In a specific implementation, the gate drive circuit 105 receives a timing signal (row signal) provided by the TCON, and generates a digital signal after each rising edge of a clock. Each digital signal corresponds to an output. Through digital-to-analog conversion, high and low levels are converted into high and low voltages required by an active switch to form a gate drive signal, so that the panel is switched on line by line and charged by a pixel electrode.

Figure 2:
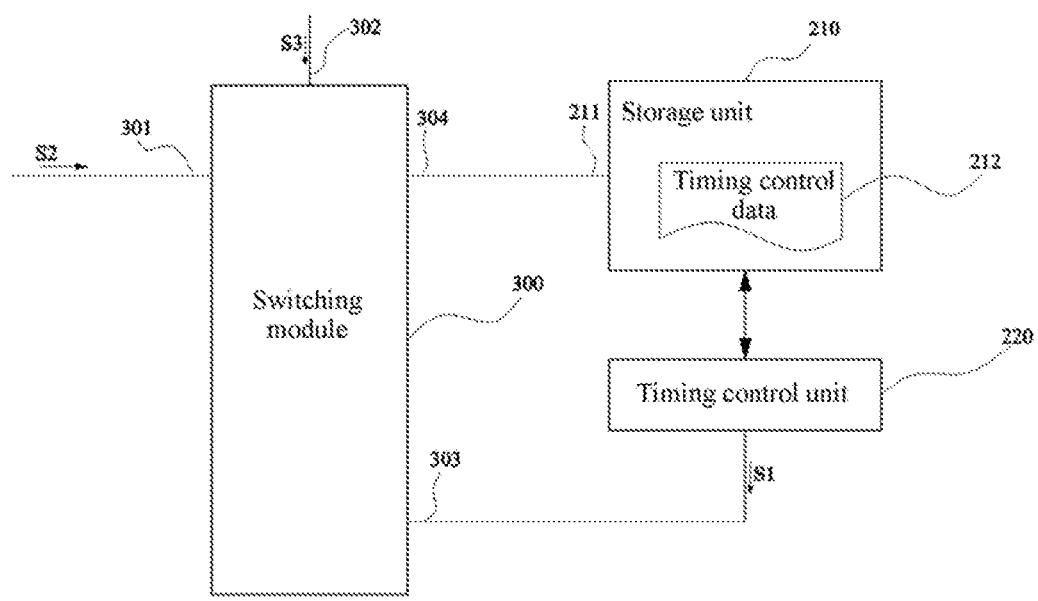
FIG. 2 is a schematic structural diagram of a data protection system of a display apparatus according to an embodiment of this application.

FIG. 2 is a schematic structural diagram of a data protection system of a display apparatus according to an embodiment of this application. As shown in FIG. 2, in an embodiment of this application, a data protection system includes: a memory 210, having a protection control end 211 and storing timing control data 212; a TCON 220, connected to the memory 210, where the TCON 220 obtains the timing control data 212 to provide a control signal S1; and a switcher 300, including a first input end 301, a second input end 302, a control end 303, and an output end 304, where the first input end 301 is electrically coupled to a read/write control signal S2, the second input end 302 is electrically coupled to a constant potential signal S3, the output end is connected to the protection control end 211, the control end transmits the control signal S1, and the switcher 300 selectively outputs the constant potential signal S3 and the read/write control signal S2 to the protection control end 211 according to a potential change of the control signal S2, where when the switcher 300 transmits and outputs the constant potential signal S3 to the protection control end 211, the switcher 300 disconnects an electrical coupling between the read/write control signal S2 and the protection control end 211, the protection control end 211 is electrically coupled to the constant potential signal S3, and the memory 210 maintains the timing control data 212 to be write-protected.

Figure 3:
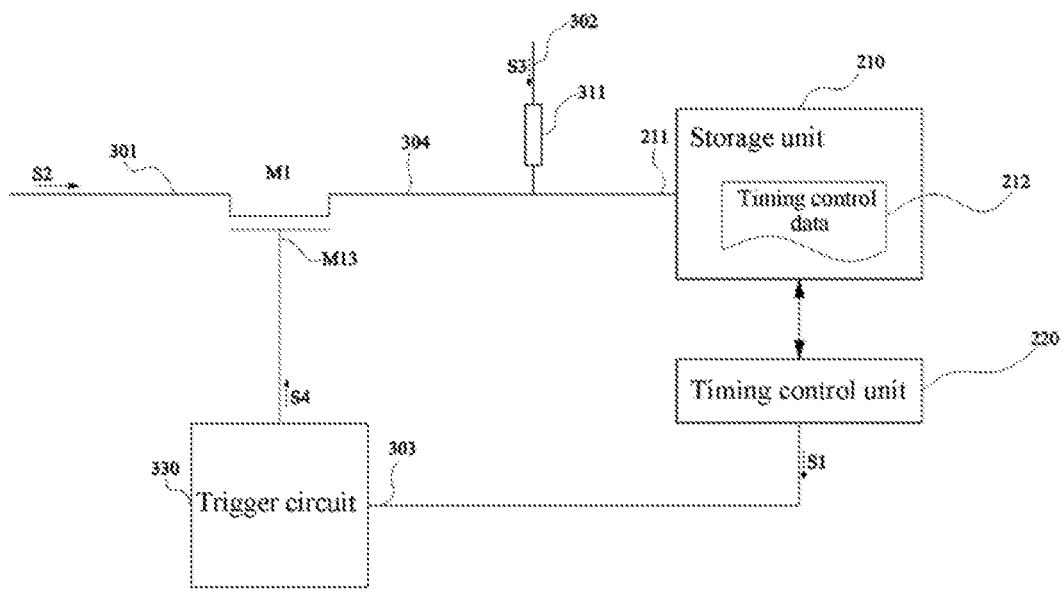
FIG. 3 is a schematic structural diagram of a data protection system of a display apparatus according to an embodiment of this application.

FIG. 3 is a schematic structural diagram of a data protection system of a display apparatus according to an embodiment of this application. As shown in FIG. 3, in an embodiment of this application, the switcher 300 includes a first resistor 311, a first switch M1, and a trigger circuit 330. A first end of the first switch M1 is equivalent to the first input end 301 and electrically coupled to the read/write control signal S2, and a second end of the first switch M1 is equivalent to the output end 304 and connected to the protection control end 211. A first end of the first resistor 311 is equivalent to the second input end 302 and electrically coupled to the constant potential signal S3, and a second end of the first resistor 311 is electrically coupled between the second end of the first switch M1 and the protection control end 211. An input end of the trigger circuit 330 is a control end 303, and an output end of the trigger circuit 330 is connected to a control end M13 of the first switch M1. The output end of the trigger circuit 330 transmits a switch signal S4 corresponding to the potential change of the control signal S1, to switch on or off the first switch M1. The first switch M1 is switched on, and the protection control end 211 is electrically coupled to the read/write control signal S2. The first switch M1 is switched off, the electrical coupling between the read/write control signal S2 and the protection control end 211 is disconnected, and the protection control end 211 is electrically coupled to the constant potential signal S3.

Figure 4:
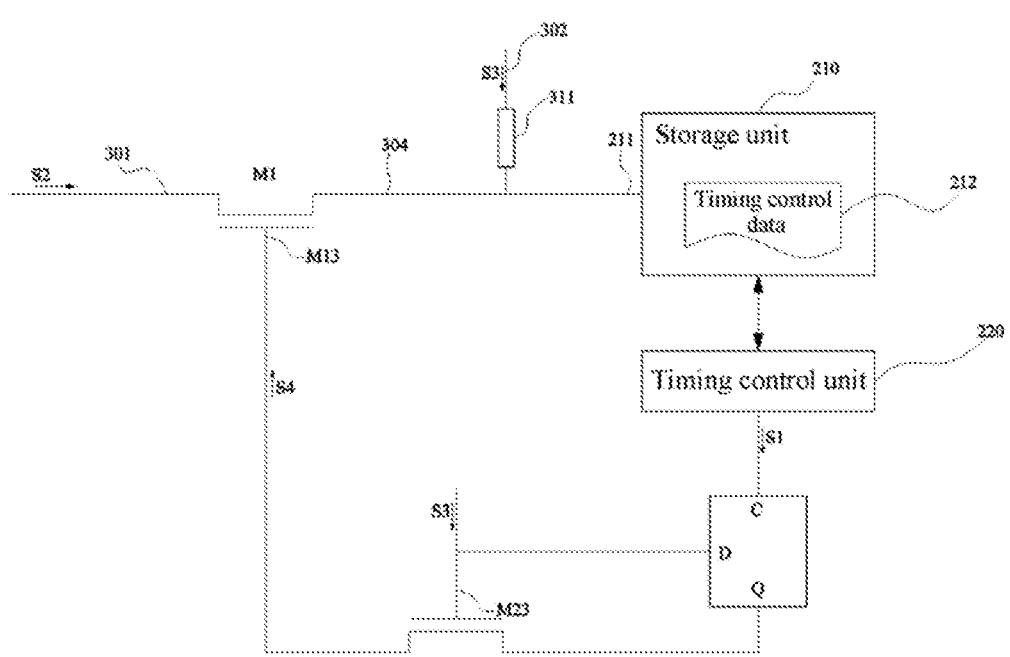
FIG. 4 is a schematic structural diagram of a data protection system of a display apparatus according to an embodiment of this application.

FIG. 4 is a schematic structural diagram of a data protection system of a display apparatus according to an embodiment of this application. As shown in FIG. 4, in an embodiment of this application, the trigger circuit 330 includes a trigger 331 and a second switch M2. A first end C of the trigger 331 is the control end 303, and a second end D of the trigger 331 is electrically coupled to the constant potential signal S3. A first end of the second switch M2 is connected to an output end Q of the trigger 331, and a second end of the second switch M2 is connected to the control end M13 of the first switch M1. The control end M13 of the first switch M1 and a control end M23 of the second switch M2 have a same polarity, the trigger 331 outputs the constant potential signal S3 to the first end of the second switch M2 according to the potential change of the control signal S1, the control end M23 of the second switch M2 is electrically coupled to the constant potential signal S3, the second switch M2 is switched on, and the constant potential signal S3 (output by the output end Q) output by the trigger 331 is transmitted to the control end M13 of the first switch M1.

In an embodiment of this application, the control signal S1 is a clock pulse signal, and when the clock pulse signal is at a rising edge, the trigger 331 transmits the signal obtained by the second end D to the output end Q, so that the trigger 331 outputs the constant potential signal S3.

Figure 5:
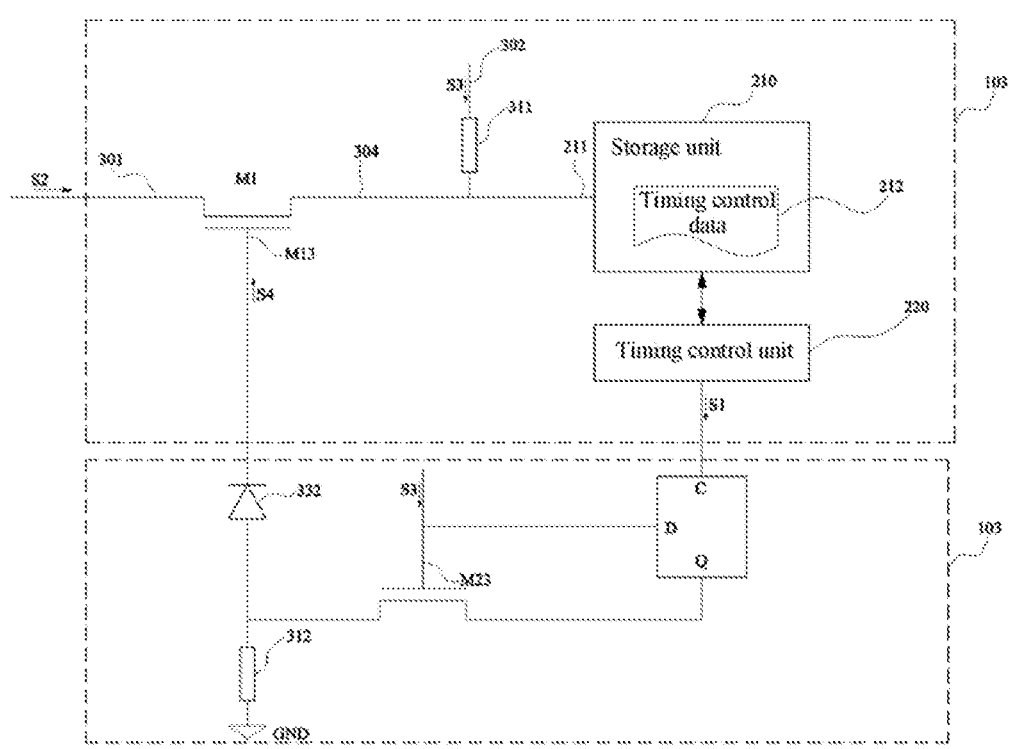
FIG. 5 is a schematic structural diagram of a data protection system of a display apparatus according to an embodiment of this application.

FIG. 5 is a schematic structural diagram of a data protection system of a display apparatus according to an embodiment of this application. As shown in FIG. 5, in an embodiment of this application, a unilateral conduction component 332 is disposed between the first switch M1 and the second switch M2, an input end of the unilateral conduction component 332 is connected to the second end of the second switch M2, and an output end of the unilateral conduction component 332 is connected to the control end of the first switch M1.

In an embodiment of this application, a second resistor 312 is connected to the second switch M2 and the unilateral conduction component 332, a first end of the second resistor 312 is connected between the second switch M2 and the unilateral conduction component 332, and a second end of the second resistor 312 is grounded GND.

In an embodiment of this application, the unilateral conduction component 332 is a diode.

In an embodiment of this application, the memory 210, the TCON 220, the first resistor 311, and the second switch M2 are disposed on a drive board (for example, the PCB 103 described above) of the display apparatus.

In an embodiment of this application, the trigger circuit 330 is disposed in a frame area or a distribution area of a display panel 106.

In an embodiment of this application, the protection control end 211 is electrically coupled to the read/write control signal S2, and the memory 210 switches, according to a potential change of the read/write control signal S2, the timing control data 212 to be readable-and-writable or write-protected.

In an embodiment of this application, the constant potential signal S3 is a constant high-potential signal.

In an embodiment of this application, the constant potential signal S3 is a constant low-potential signal.

In an embodiment of this application, a condition potential at which the memory 210 is read and written or write-protected, a potential of the read/write control signal S2, and a ground potential are correspondingly adjusted according to a potential of the constant potential signal S3.

Figure 6:
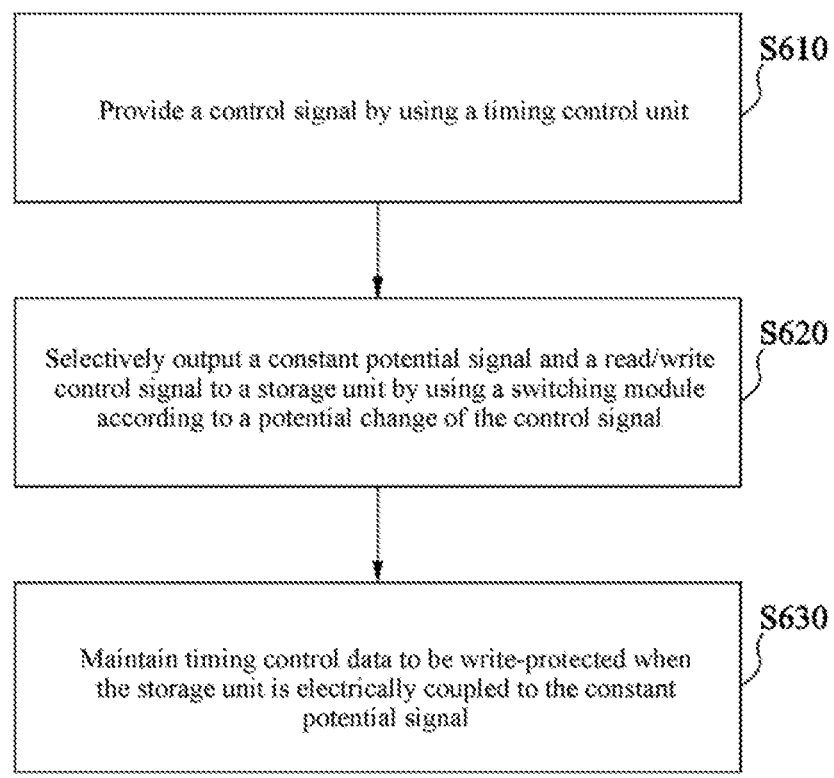
FIG. 6 is a schematic diagram of a data protection procedure of a display apparatus according to an embodiment of this application.

FIG. 6 is a schematic diagram of a data protection procedure of a display apparatus according to an embodiment of this application. Refer to FIG. 1 and FIG. 5 for better understanding. In an embodiment of this application, a data protection method of a display apparatus includes:

Step S610. Provide a control signal S1 by using a TCON 220.

Step S620. Selectively output a constant potential signal S3 and a read/write control signal S2 to a memory 210 by using a switcher 300 according to a potential change of the control signal S1.

Step S630. Maintain timing control data 212 to be write-protected when the memory 210 is electrically coupled to the constant potential signal S3.

In an embodiment of this application, when the memory 210 obtains the read/write control signal S2, the memory 210 switches, according to a potential change of the read/write control signal S2, the timing control data 212 to be readable-and-writable or write-protected.

In an embodiment of this application, the switcher 300 includes a first switch M1 and a trigger circuit 330; and the step of selectively outputting a constant potential signal S3 and a read/write control signal S2 to a memory 210 by using a switcher 300 according to a potential change of the control signal S1 includes: controlling switching-on and switching-off of the first switch M1 by using a switch signal S4 output by the trigger circuit 330, where a potential change of the switch signal S4 corresponds to the potential change of the control signal S1, where when the first switch M1 is switched on, the memory 210 is electrically coupled to the read/write control signal S2 by using the first switch M1; or when the first switch M1 is switched off, the first switch M1 disconnects an electrical coupling between the memory 210 and the read/write control signal S2, and the memory 210 is electrically coupled to the constant potential signal S3.

In an embodiment of this application, a data protection system of a display apparatus includes: a memory 210, having a protection control end 211 and storing timing control data 212; a TCON 220, connected to the memory 210, where the TCON 220 obtains the timing control data 212 to provide a clock pulse signal; and a first switch M1, where a first end of the first switch M1 is electrically coupled to a read/write control signal S2, and a second end of the first switch M1 is connected to the protection control end 211; a first resistor 311, where a first end of the first resistor 311 is electrically coupled to a constant high-potential signal, and a second end of the first resistor 311 is connected between the second end of the first switch M1 and the protection control end 211; a trigger 331, where a first end C of the trigger 331 is electrically coupled to the control signal S1, and a second end D of the trigger 331 is electrically coupled to a constant high-potential signal; a second switch M2, where a first end of the second switch M2 is electrically coupled to an output end Q of the trigger 331, a control end M23 of the second switch M2 is electrically coupled to a constant high-potential signal, and the second switch M2 is switched on; a diode, where an input end of the diode is connected to a second end of the second switch M2, and an output end of the diode is connected to a control end M13 of the first switch M1; a second resistor 312, where a first end of the second resistor 312 is connected between the second switch M2 and a unilateral conduction component 332, and a second end of the second resistor 312 is grounded, where when the clock pulse signal at a rising edge, the trigger 331 outputs the constant high-potential signal, the constant high-potential signal is transmitted to the control end of the first switch M1 by using the second switch M2 and the diode, the first switch M1 is switched on, the protection control end 211 is electrically coupled to the read/write control signal S2, and the memory 210 switches, according to a potential change of the read/write control signal S2, the timing control data 212 to be readable and writable or write protected; or when the clock pulse signal is at a falling edge or a low potential or has no signal, the trigger 331 has no output, the first switch M1 is switched off to disconnect the electrical coupling between the protection control end 211 and the read/write control signal S2, and when the memory 210 is electrically coupled to the constant potential signal S3, the memory 210 maintains the timing control data 212 to be write protected.

In this application, a data write-protected or data readable-and-writable mechanism of the storage element is controlled by connecting and disconnecting the electrical coupling between the storage element and the read/write control signal, so as to avoid an incorrect setting of a write protection state of the memory which leads to re-writing of the timing controlling data, and avoid an abnormal image of the display apparatus. This application does not dramatically change the existing production procedure, and is adapted to various existing manufacturing processes of the display apparatus. This application can be adapted to various types of display panels and have relatively high applicability.

The display panel of this application includes a first substrate and a second substrate. The first substrate and the second substrate may be, for example, an active array switch (Thin Film Transistor, TFT) substrate, and a color filter (CF) substrate. However, the present invention is not limited thereto. In an embodiment, the active array switch and the CF may be formed on a same substrate.

In some embodiments, the display panel in this application may be, for example, a liquid crystal display panel, but the present invention is not limited thereto. The display panel may also be an OLED display panel, a W-OLED display panel, a QLED display panel, a plasma display panel, a curved display panel, or a display panel of another type.

The phrases such as "in some embodiments" and "in various embodiments" are repeatedly used. The phrases generally refer to different embodiments, but they may also refer to a same embodiment. The terms such as "comprise", "have", "include", and variants thereof are synonyms, unless other meanings are indicated in the context.

The above descriptions are merely exemplary embodiments of this application, and are not intended to limit this application in any form. Although this application has been disclosed above through the exemplary embodiments, the embodiments are not intended to limit this application. A person skilled in the art can make some equivalent variations, variations, or modifications to the above-disclosed technical contents without departing from the scope of the technical solutions of this application to obtain equivalent embodiments. Any simple variation, equivalent change or modification made to the above embodiments according to the technical essence of this application without departing from the content of the technical solutions of this application shall fall within the scope of the technical solutions of this application.

What is claimed is:

1. A data protection system of a display apparatus, comprising:
    a memory, having a protection control end and storing timing control data;
    a timing controller (TCON), connected to the memory, wherein the TCON obtains the timing control data to provide a control signal; and
    a switcher, comprising a first input end, a second input end, a control end, and an output end, wherein the first input end is electrically coupled to a read/write control signal, the second input end is electrically coupled to a constant potential signal, the output end is connected to the protection control end, the control end transmits the control signal, and the switcher selectively outputs the constant potential signal and the read/write control signal to the protection control end according to a potential change of the control signal, wherein when the switcher transmits and outputs the constant potential signal to the protection control end, the switcher disconnects an electrical coupling between the read/write control signal and the protection control end, the protection control end is electrically coupled to the constant potential signal, and the memory maintains the timing control data to be write-protected.

2. The data protection system of a display apparatus according to claim 1, wherein
    the switcher comprises a first resistor, a first switch, and a trigger circuit;
    a first end of the first switch is electrically coupled to the read/write control signal, and a second end of the first switch is connected to the protection control end;
    a first end of the first resistor is electrically coupled to the constant potential signal, and a second end of the first resistor is electrically coupled between the second end of the first switch and the protection control end; and
    an input end of the trigger circuit is the control end, and an output end of the trigger circuit is connected to a control end of the first switch, wherein
    the output end of the trigger circuit transmits a switch signal corresponding to the potential change of the control signal, to switch on or off the first switch; and the first switch is switched off, the electrical coupling between the read/write control signal and the protection control end is disconnected, the protection control end is electrically coupled to the constant potential signal, the first switch is switched on, and the protection control end is electrically coupled to the read/write control signal.

3. The data protection system of a display apparatus according to claim 2, wherein
    the trigger circuit comprises a trigger and a second switch;
    a first end of the trigger is the control end, and a second end of the trigger is electrically coupled to the constant potential signal; and
    a first end of the second switch is connected to an output end of the trigger, and a second end of the second switch is connected to the control end of the first switch, wherein
    the control end of the first switch and a control end of the second switch have a same polarity, the trigger outputs the constant potential signal to the first end of the second switch according to the potential change of the control signal, the control end of the second switch is electrically coupled to the constant potential signal, the second switch is switched on, and the constant potential signal is transmitted to the control end of the first switch.

4. The data protection system of a display apparatus according to claim 3, wherein the control signal is a clock pulse signal, and when the clock pulse signal is at a rising edge, the trigger outputs the constant potential signal.

5. The data protection system of a display apparatus according to claim 3, wherein a unilateral conduction component is disposed between the first switch and the second switch, an input end of the unilateral conduction component is connected to the second end of the second switch, and an output end of the unilateral conduction component is connected to the control end of the first switch; and a second resistor is connected to the second switch and the unilateral conduction component, a first end of the second resistor is connected between the second switch and the unilateral conduction component, and a second end of the second resistor is grounded.

6. The data protection system of a display apparatus according to claim 2, wherein the memory, the TCON, the first resistor, and a second switch are disposed on a drive board of the display apparatus; and the trigger circuit is disposed in a frame area or a distribution area of a display panel.

7. The data protection system of a display apparatus according to claim 1, wherein the constant potential signal is a constant high-potential signal; or the constant potential signal is a constant low-potential signal.

8. A data protection method of a display apparatus, comprising:
providing a control signal by using a timing controller;
selectively outputting a constant potential signal and a read/write control signal to a memory by using a switcher according to a potential change of the control signal; and
maintaining timing control data to be write-protected when the memory is electrically coupled to the constant potential signal.

9. The data protection method of a display apparatus according to claim 8, wherein the switcher comprises a first switch and a trigger circuit; and the step of selectively outputting a constant potential signal and a read/write control signal to a memory by using a switcher according to a potential change of the control signal comprises:
controlling switching-on and switching-off of the first switch by using a switch signal output by the trigger circuit, wherein a potential change of the switch signal corresponds to the potential change of the control signal, wherein
when the first switch is switched on, the memory is electrically coupled to the read/write control signal by using the first switch; or
when the first switch is switched off, the first switch disconnects an electrical coupling between the memory and the read/write control signal, and the memory is electrically coupled to the constant potential signal.

10. The data protection method of a display apparatus according to claim 9, wherein the trigger circuit comprises a trigger and a second switch, a first end of the trigger is a control end, and a second end of the trigger is electrically coupled to the constant potential signal.

11. The data protection method of a display apparatus according to claim 9, wherein a first end of the second switch is connected to an output end of the trigger, and a second end of the second switch is connected to a control end of the first switch.

12. The data protection method of a display apparatus according to claim 9, wherein a control end of the first switch and a control end of a second switch have a same polarity, the trigger outputs the constant potential signal to a first end of the second switch according to the potential change of the control signal, the control end of the second switch is electrically coupled to the constant potential signal, the second switch is switched on, and the constant potential signal is transmitted to the control end of the first switch.

13. The data protection method of a display apparatus according to claim 12, wherein the control signal is a clock pulse signal, and when the clock pulse signal is at a rising edge, the trigger outputs the constant potential signal.

14. The data protection method of a display apparatus according to claim 12, wherein the constant potential signal is a constant high-potential signal; or the constant potential signal is a constant low-potential signal.

15. A data protection system of a display apparatus, comprising:

a memory, having a protection control end and storing timing control data;
a timing controller (TCON), connected to the memory, wherein the TCON obtains the timing control data to provide a clock pulse signal;
a first switch, wherein a first end of the first switch is electrically coupled to a read/write control signal, and a second end of the first switch is connected to the protection control end;
a first resistor, wherein a first end of the first resistor is electrically coupled to a constant high-potential signal, and a second end of the first resistor is connected between the second end of the first switch and the protection control end;
a trigger, wherein a first end of the trigger is electrically coupled to the control signal, and a second end of the trigger is electrically coupled to a constant high-potential signal;
a second switch, wherein a first end of the second switch is electrically coupled to an output end of the trigger, a control end of the second switch is electrically coupled to a constant high-potential signal, and the second switch is switched on;
a diode, wherein an input end of the diode is connected to a second end of the second switch, and an output end of the diode is connected to a control end of the first switch; and
a second resistor, wherein a first end of the second resistor is connected between the second switch and a unilateral conduction component, and a second end of the second resistor is grounded, wherein
when the clock pulse signal at a rising edge, the trigger outputs the constant high-potential signal, the constant high-potential signal is transmitted to the control end of the first switch by using the second switch and the diode, the first switch is switched on, the protection control end is electrically coupled to the read/write control signal, and the memory switches, according to a potential change of the read/write control signal, the timing control data to be readable-and-writable or write-protected; or
when the clock pulse signal is at a falling edge or a low potential or has no signal, the trigger has no output, the first switch is switched off to disconnect the electrical coupling between the protection control end and the read/write control signal, and when the memory is electrically coupled to the constant potential signal, the memory maintains the timing control data to be write-protected.

16. The data protection system of a display apparatus according to claim 15, wherein the control end of the first switch and the control end of the second switch have a same polarity, the trigger outputs the constant potential signal to the first end of the second switch according to a potential change of the control signal, the control end of the second switch is electrically coupled to the constant potential signal, the second switch is switched on, and the constant potential signal is transmitted to the control end of the first switch.

17. The data protection system of a display apparatus according to claim 15, wherein an input end of the unilateral conduction component is connected to the second end of the second switch, and an output end of the unilateral conduction component is connected to the control end of the first switch; and the second resistor is connected to the second switch and the unilateral conduction component, the first end of the second resistor is connected between the second switch and the unilateral conduction component, and the second end of the second resistor is grounded.

\* \* \* \* \*